(12) United States Patent
Shibuya

(10) Patent No.: US 10,544,363 B2
(45) Date of Patent: Jan. 28, 2020

(54) CERAMIC EMITTER

(71) Applicant: NEC Corporation, Tokyo (JP)

(72) Inventor: Akinobu Shibuya, Tokyo (JP)

(73) Assignee: NEC Corporation, Tokyo (JP)

( * ) Notice: Subject to any disclaimer, the term of this patent is extended or adjusted under 35 U.S.C. 154(b) by 285 days.

(21) Appl. No.: 15/510,773

(22) PCT Filed: Sep. 11, 2015

(86) PCT No.: PCT/JP2015/004644
§ 371 (c)(1),
(2) Date: Mar. 13, 2017

(87) PCT Pub. No.: WO2016/042749
PCT Pub. Date: Mar. 24, 2016

(65) Prior Publication Data
US 2017/0253797 A1   Sep. 7, 2017

(30) Foreign Application Priority Data

Sep. 18, 2014  (JP) .................... 2014-190274

(51) Int. Cl.
*B01J 23/00* (2006.01)
*B01J 23/10* (2006.01)
(Continued)

(52) U.S. Cl.
CPC ...... *C09K 11/7706* (2013.01); *C01F 17/0025* (2013.01); *C01G 15/006* (2013.01);
(Continued)

(58) Field of Classification Search
CPC ............ C09K 11/7706; C09K 11/7769; C09K 11/7701; C01G 15/006; C01G 15/00;
(Continued)

(56) References Cited

U.S. PATENT DOCUMENTS 5,686,368 A    11/1997  Wong
2003/0078156 A1  4/2003  Lowden et al.

FOREIGN PATENT DOCUMENTS

JP   2001-068064 A    3/2001
JP   2002-537537 A   11/2002
(Continued)

OTHER PUBLICATIONS

Garskaite et al. "Luminescent properties of rare earth (Er, Yb) doped yttrium aluminium garnet thin films and bulk samples synthesised by an aqueous sol-gel technique" Journal of the European Ceramic Society 30 (2010) 1707-1715 (Year: 2010).*

(Continued)

*Primary Examiner* — Haytham Soliman
(74) *Attorney, Agent, or Firm* — Wilmer Cutler Pickering Hale and Dorr LLP

(57) ABSTRACT

[Objective] To provide a ceramic emitter that exhibits high radiation intensity and excellent wavelength selectivity.
[Solution] A ceramic emitter includes a polycrystalline body that has a garnet structure represented by a compositional formula $R_3Al_5O_{12}$ (R: rare-earth element) or $R_3Ga_5O_{12}$ (R: rare-earth element) and has pores with a porosity of 20-40%. The pores have a portion where the pores are connected to one another but not linearly continuous, inside the polycrystalline body.

6 Claims, 11 Drawing Sheets

(51) Int. Cl.
  *C09K 11/77* (2006.01)
  *H01L 31/055* (2014.01)
  *H02S 10/30* (2014.01)
  *C01F 17/00* (2006.01)
  *C01G 15/00* (2006.01)

(52) U.S. Cl.
  CPC ........ *C09K 11/7701* (2013.01); *H01L 31/055* (2013.01); *H02S 10/30* (2014.12); *C01P 2002/30* (2013.01); *C01P 2004/61* (2013.01); *C01P 2006/12* (2013.01); *C01P 2006/60* (2013.01)

(58) Field of Classification Search
  CPC .... C01F 17/0025; H02S 10/30; H01L 31/055; C04B 35/44; C04B 2235/3224; C04B 2235/77; C04B 2235/764; C04B 2235/6567; C04B 2235/3286; C04B 38/0074; C04B 35/01; C01P 2002/30; C01P 2004/61; C01P 2006/60; C01P 2006/12; Y02E 10/52
  USPC ........................................................ 502/302
  See application file for complete search history.

(56) References Cited

FOREIGN PATENT DOCUMENTS

| | | |
|---|---|---|
| JP | 3472838 B2 | 9/2003 |
| JP | 2004-131369 A | 4/2004 |
| JP | 2004-363297 A | 12/2004 |
| JP | 2010-202708 A | 9/2010 |

OTHER PUBLICATIONS

International Search Report corresponding to PCT/JP2015/004644, dated Nov. 17, 2015 (5 pages).
Written Opinion corresponding to PCT/JP2015/004644, dated Nov. 17, 2015 (6 pages).
D. Diso, et al., "Selective Emitters for High Efficiency TPV Conversion: Materials Preparation and Characterization," Proceedings of 5th Conference on Thermophotovoltaic Generation of Electricity, vol. 653, 2003, pp. 132-141.
Narihito Nakagawa, "Kenkyu Shokai, The Present State of the Thermophotovoltaic System and Its Selective Emitter Materials Technology," Oyo Butsuri, vol. 76, No. 3, Nobuo Iwase, The Japan Society of Applied Physics, 2007, pp. 281-285.
Japanese Notice of Reasons for Refusal issued in Japanese Patent Application No. 2016-548556, dated May 21, 2019, 4 pages.

* cited by examiner

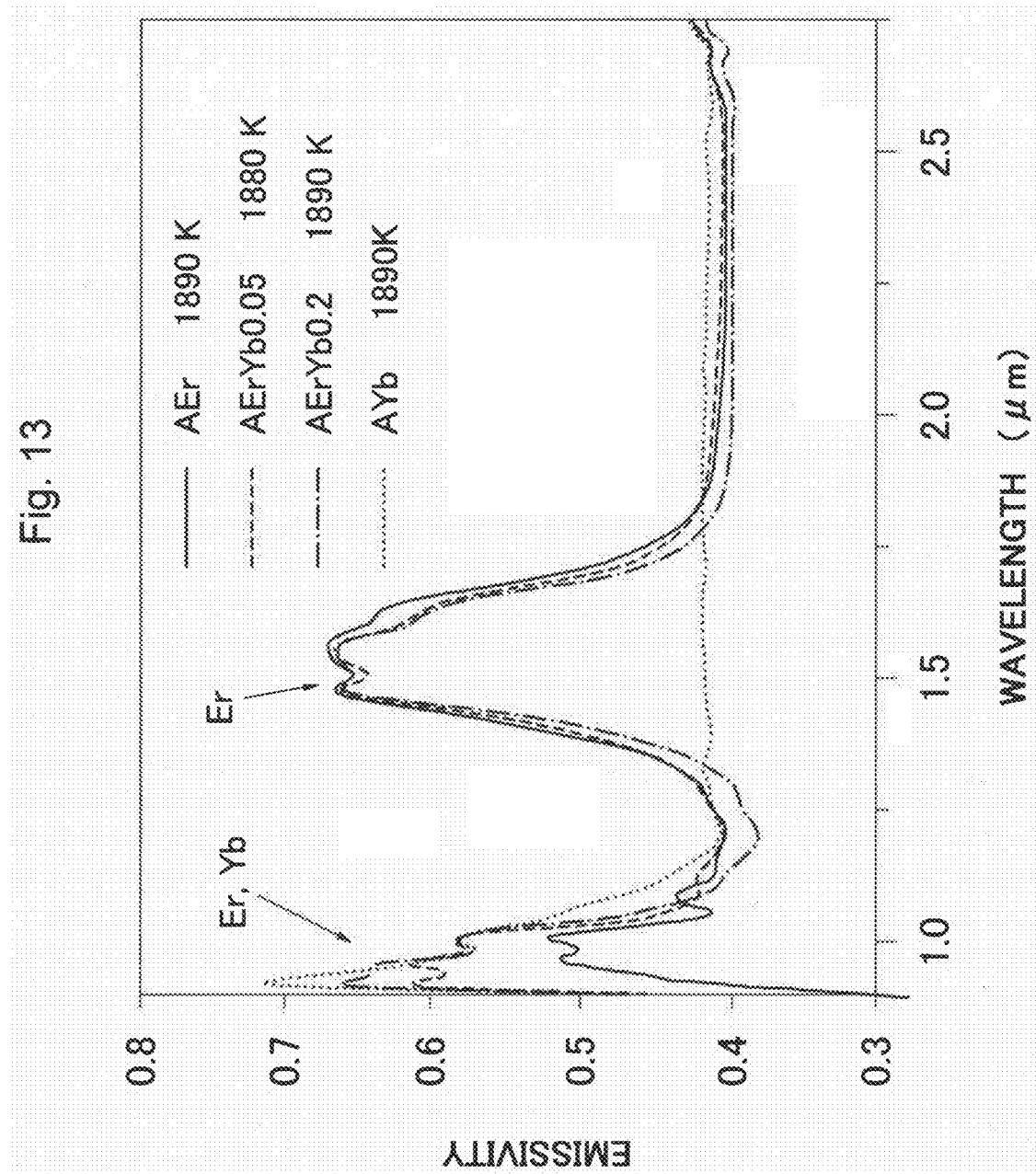

CERAMIC EMITTER

CROSS-REFERENCE TO RELATED APPLICATIONS

This application is a national stage application of International Application No. PCT/JP2015/004644 entitled "CERAMIC EMITTER," filed on Sep. 11, 2015, which claims the benefit of the priority of Japanese Patent Application No. 2014-190274, filed on Sep. 18, 2014, the disclosures of each of which are hereby incorporated by reference in their entirety.

TECHNICAL FIELD

The present invention relates to a ceramic emitter, particularly to a ceramic emitter for a thermophotovoltaic device.

BACKGROUND ART

Thermophotovoltaic power generation is a technique of converting thermal radiation to electric power using a photoelectric conversion cell. The thermophotovoltaic power generation is attracting attention as a power generating technology that promises highly efficient power generation by controlling a radiation spectrum, allows to use a variety of thermal sources, and provides high energy density per unit weight.

FIG. 9 illustrates a basic configuration of thermophotovoltaic power generation. The configuration includes: converting heat generated from combustion equipment or heat generated by condensing solar light to infrared radiation by an emitter 4; allowing the infrared light to enter a photoelectric conversion cell 5; and converting the infrared light to electric power. While a variety of emitter materials are reported, the necessary condition for increasing the efficiency of thermal photovoltaic power is narrowing down the infrared spectrum to a wavelength matched with the photoelectric conversion cell.

FIG. 10 illustrates a configuration of a thermophotovoltaic power generation device where a photonic crystal 6 is provided on the surface of the emitter. For example, as described in PTL 1, there has been suggested a control of an infrared spectrum using a photonic crystal where many cavities are formed on metal. However, a metal emitter has a drawback that it is degraded by oxidization or recrystallization upon being used at a high temperature.

Further, as illustrated in FIG. 11, there has been suggested a configuration with an optical filter between an emitter and a photoelectric conversion cell. However, when the optical filter 7 is used, it is not possible to increase efficiency unless the emitter reflects/absorbs infrared light other than the wavelength adaptable to the photoelectric conversion cell. Thus, the configuration has drawbacks that the device structure becomes complicated and realizing a high heat-resistant filter is difficult.

Therefore, emitters using ceramic that has excellent oxidation resistance and heat resistance have been actively studied and developed. PTL 2 reports a thermophotovoltaic device that includes: a burner that combusts fuels; a radiant burner screen that has a substrate including a porous or perforated material with heat resistance; and a photovoltaic cell arrangement. The radiant burner screen is coated with a chemical compound including a rare-earth element, thereby forming an infrared emitter. As for the coating chemical compound, ytterbium substituted yttrium aluminum garnet (Yb: YAG) is reported.

Chemical compounds having rare-earth elements are known as providing a selective thermal radiation at a wavelength corresponding to the absorption of 4f electron transition of the rare earth ions. Therefore, there have been reported cases of ceramic emitters using rare earth aluminum garnet. Such reports include, for example, NPL 1 and NPL 2.

NPL 1 reports an emitter that is configured by forming, on SiC ceramic, a composite coating of alumina or zirconia fibers and erbium aluminum garnet, $Er_3Al_5O_{12}$ (ErAG), that has 50% or more porosity and 50 to 500 µm in thickness. FIG. 12 illustrates a thermal radiation spectrum of the ErAG composite and SiC ceramic at 1050° C. Although a selected wavelength radiation can be observed around a wavelength of 1600 nm, there is a drawback that the radiation intensity is relatively smaller compared with SiC that has emissivity of 0.9.

Further, NPL 2 reports an emitter that selectively uses melt growth composite materials made of alumina and rare-earth aluminum garnet where Er and Yb are selected as the rare-earths. FIG. 13 illustrates the wavelength dependency of the emissivity of such emitters. There is a drawback that the emissivity of around 0.7 even at a peak value is relatively smaller compared with SiC whose emissivity is 0.9 thorough the entire wavelength range. Further, when the wavelength selectivity of emissivity is defined by the ratio of the emissivity at a peak wavelength to the emissivity at a wavelength of 1750 nm, the ratio is 1.7 for a composite of YbAG and alumina, 1.5 for a composite of ErAG and alumina, which are not very good results.

CITATION LIST

Patent Literature

[PTL 1] Publication of Japanese Patent No. 3472838
[PTL 2] Japanese Laid-Open Patent Application Publication (Translation of PCT Application) No. 2002-537537

Non Patent Literature

[NPL 1] D. Diso, A. Licciulli, A. Bianco, G. Leo, G. Torsello, S. Tundo, A. De Risi and M. Mazzer, Proceedings of 5th conference on Thermophotovoltaic Generation of Electricity, vol. 653, pp. 132-141, 2003 "Selective Emitters for High Efficiency TPV Conversion: Materials Preparation and Characterization"
[NPL 2] Narihito Nakagawa, Shibata Kohji, OYOBU-TURI, vol. 76, no. 3, pp. 281-285, 2007, "The present state of the thermophotovoltaic system and its selective emitter materials technology"

SUMMARY OF INVENTION

Technical Problem

As described above, the emitters for thermophotovoltaic devices using ceramic materials disclosed in the above-mentioned literature exhibit low radiation intensity and insufficient wavelength selectivity.

The objective of the present invention is to provide a ceramic emitter that exhibits high radiation intensity and excellent wavelength selectivity.

Solution to Problem

The ceramic emitter of the present invention includes a polycrystalline body that has a garnet structure represented by a compositional formula $R_3Al_5O_{12}$ (R: rare-earth element) or $R_3Ga_5O_{12}$ (R: rare-earth element) and has pores of a porosity of not less than 20% and not more than 40%. The pores include a portion where the pores are connected to one another but not linearly continuous, inside the polycrystalline body.

Advantageous Effects of Invention

The ceramic emitter of the present invention can achieve thermal radiation that exhibits high radiation intensity and excellent wavelength selectivity.

BRIEF DESCRIPTION OF DRAWINGS

FIG. 13 is a thermal radiation spectrum of emitters of NPL 1.

DESCRIPTION OF EMBODIMENTS

The following will describe the details of the example embodiment of the present invention.

The emitter of the present example embodiment is a polycrystalline body formed by a compositional formula represented as $R_3Al_5O_{12}$ (R: rare-earth element) or $R_3Ga_5O_{12}$ (R: rare-earth element), and the crystal has a garnet structure. It is known that rare-earth aluminum garnet indicates wavelength selectivity in a thermal radiation spectrum. Whereas, in the present example embodiment, the amount of pores in the polycrystalline body and the shapes of the pores are controlled in the above-described rare earth aluminum garnet and rare earth gallium garnet ceramic. Due to this, improved wavelength selectivity in the thermal radiation spectrum (suppressing radiation of unnecessary wavelength) and increased radiation intensity at a peak wavelength are observed.

Figure 1:
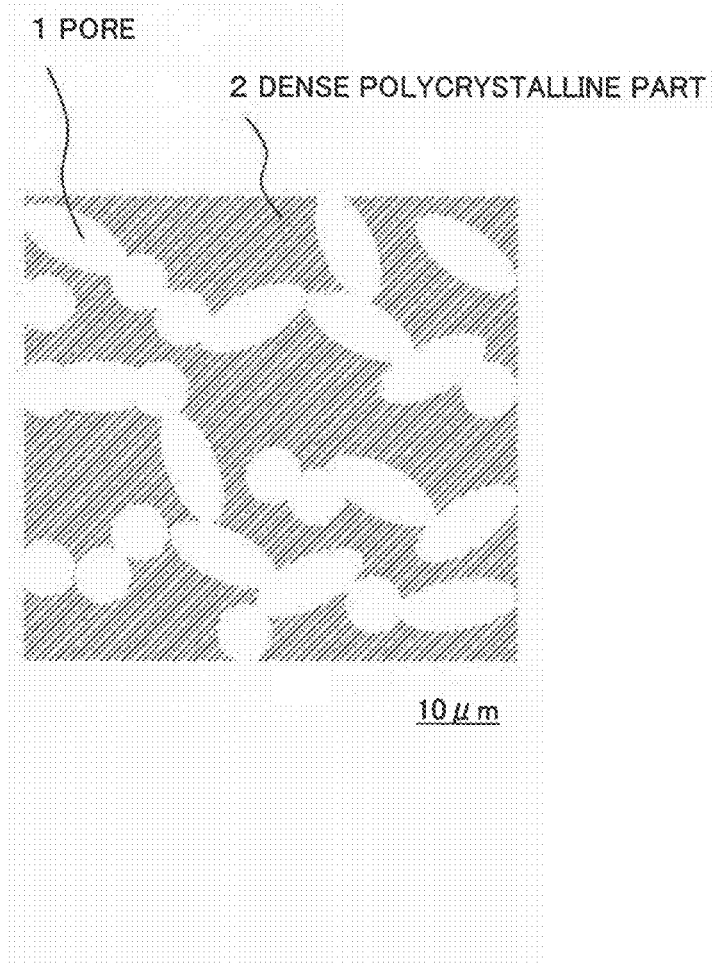
FIG. 1 is an exemplary cross-sectional view illustrating a mode of a ceramic emitter representing an example embodiment of the present invention.

The ceramic in which increase in the above characteristics can be observed has a porosity of not less than 20% and not more than 40%. The polycrystalline body is configured by dense polycrystalline parts 2 and pores 1, as illustrated in the exemplary diagram representing a portion of a cross section of the polycrystalline body in FIG. 1. The pores 1 include a portion where the pores are connected to one another but not linearly continuous. There is a drawback that the wavelength selectivity of the thermal radiation spectrum is degraded when the porosity is less than 20%, while the mechanical strength is reduced when the porosity is 40% or more. Further, when the porosity is 40% or more, the pores are linearly connected and the radiation light from the heat source is transmitted therethrough, thus, the effect of improved wavelength selectivity cannot be obtained.

Further, the method of producing the ceramic emitter of the present example embodiment is not limited. The ceramic emitter can be produced by easy processes based on mixing, pressing, and firing of raw materials, since the production can be done by solid-state reaction using ceramic powder as the raw material.

While the sizes and shapes of the pores are not limited, the cross-section area of a pore is preferably not more than 5 $\mu m^2$ so that the above-described porosity is realized and the pores are not linearly connected. Further, it is considered that the sizes of the pores influence the above-described radiation characteristics. Further, the crystal particle size is not limited, however, it is preferable to be 5 $\mu m$ or less, so as to realize the above-described porosity and prevent the pores from being linearly connected.

Further, with the ceramic emitter of the present example embodiment, the selected wavelength of thermal radiation can be varied by a rare-earth element corresponding to R of the above-described compositional formula. However, the radiation spectrum is matched with the sensitivity wavelength of the photoelectric conversion cell so as to adapt the ceramic emitter to thermophotovoltaic devices. Thus, when an Si cell is used as a photovoltaic device, Yb with peak wavelength in the thermal radiation spectrum of at around 1000 nm is preferably used as a rare-earth element. Further, when a GaSb cell is used as a photovoltaic device, Er with peak wavelength in the thermal radiation spectrum of at around 1500 nm is preferably used as a rare-earth element.

Further, the external shape and size of the emitter of the present example embodiment are not limited. However, from the perspective that the through pores should not be linearly connected and the perspective of mechanical strength, the thickness of the emitter is preferably 0.8 mm or more when the emitter is a plate. Further, the size of the shortest side or the diameter is preferably 0.8 mm or more when the emitter is a rectangular parallelepiped or cylindrical stick shape.

It is noted that the above-described PTL 2 also has a drawback that the production is difficult due to the complicated structure as the substrate including a porous or perforated material is coated with Yb: YAG. Further, NPL 1 also has a drawback that the production process becomes complicated since the alumina and zirconia fibers need to be produced and the coating is formed by a sol-gel method. Still further, NPL 2 also has a drawback that the production is difficult as materials need to be melted at a temperature as high as 2193 K when synthesizing. However, the present example embodiment is immune to such drawbacks.

EXAMPLES

The following will describe the details of examples of the present invention.

Example 1

As materials of a ceramic emitter, $Yb_2O_3$ and $Al_2O_3$ powders are used and weighed at a stoichiometric mixture ratio such that the mixture becomes $Yb_3Al_5O_{12}$ after synthesizing. Subsequently, the mixture is added with ethanol and wet-mixed in an agate mortar, then calcined for two hours at 1600° C. in the atmosphere, thereby obtaining a garnet crystal of the above-described compositional formula by solid-state reaction. Thereafter, the garnet crystal is grounded in an agate mortar, pressed into a pellet, and fired at 1600° C. for 12 hours, thereby obtaining a polycrystalline sintered body of a disc shape. The pellet size after sintering is 12.8 mm in diameter and 1.1 mm in thickness. The porosity of this sintered body is confirmed as 36% by a density measurement using the Archimedes method. Further, to prevent water from infiltrating the pores, the density measurement is performed after coating the surface of the sintered body with a cellulose resin.

Figure 2:
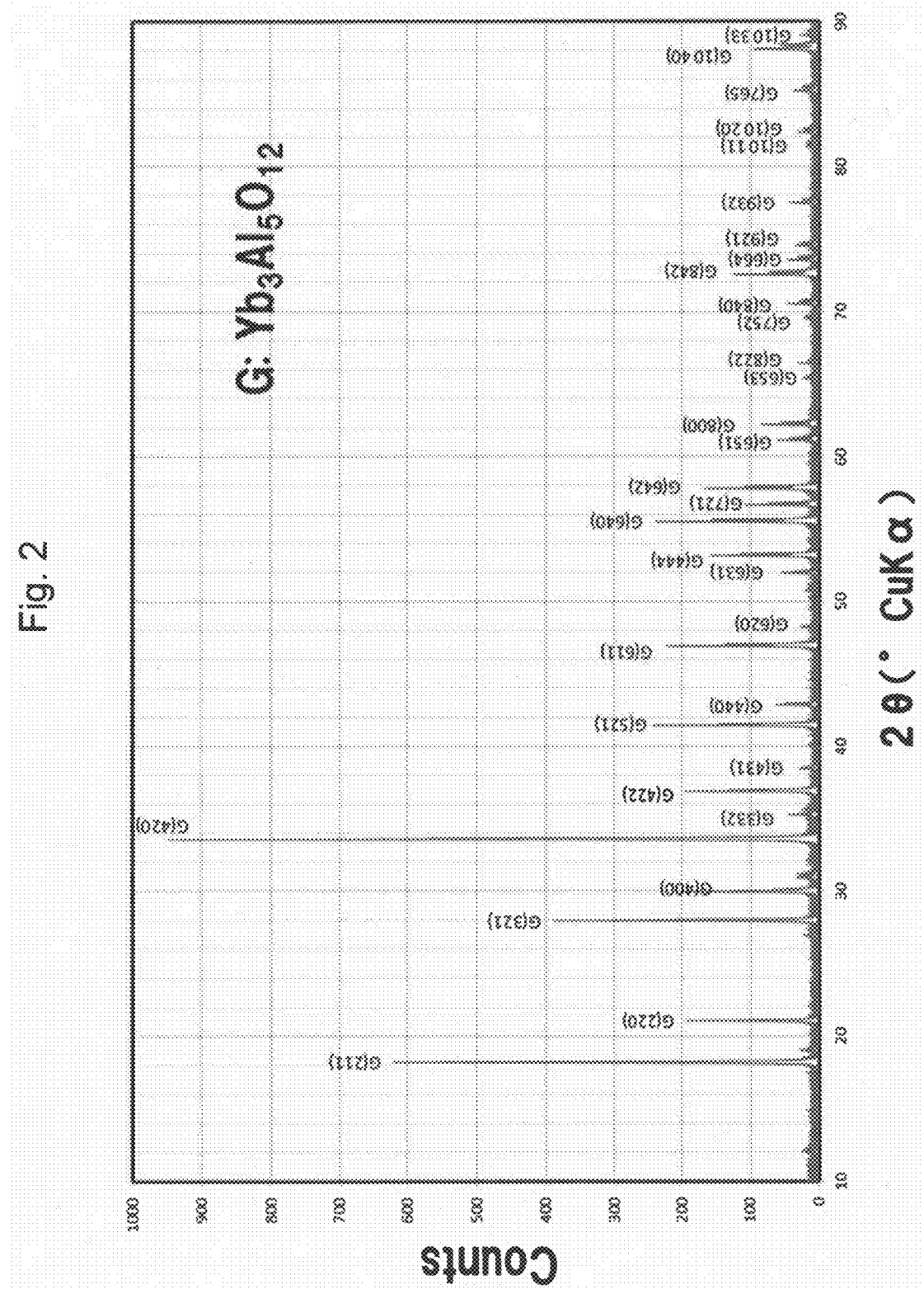
FIG. 2 is an X-ray diffraction (XRD) pattern of the emitter of Example 1 of the present invention.
Figure 3:
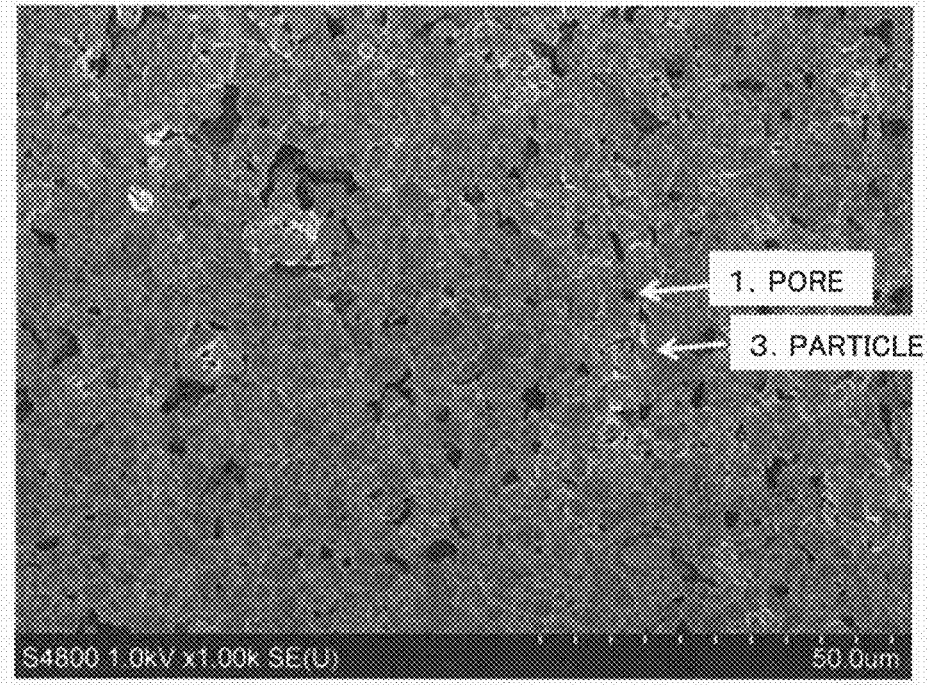
FIG. 3 is a scanning electron microscope (SEM) photograph of the surface of the emitter of Example 1 of the present invention.
Figure 4:
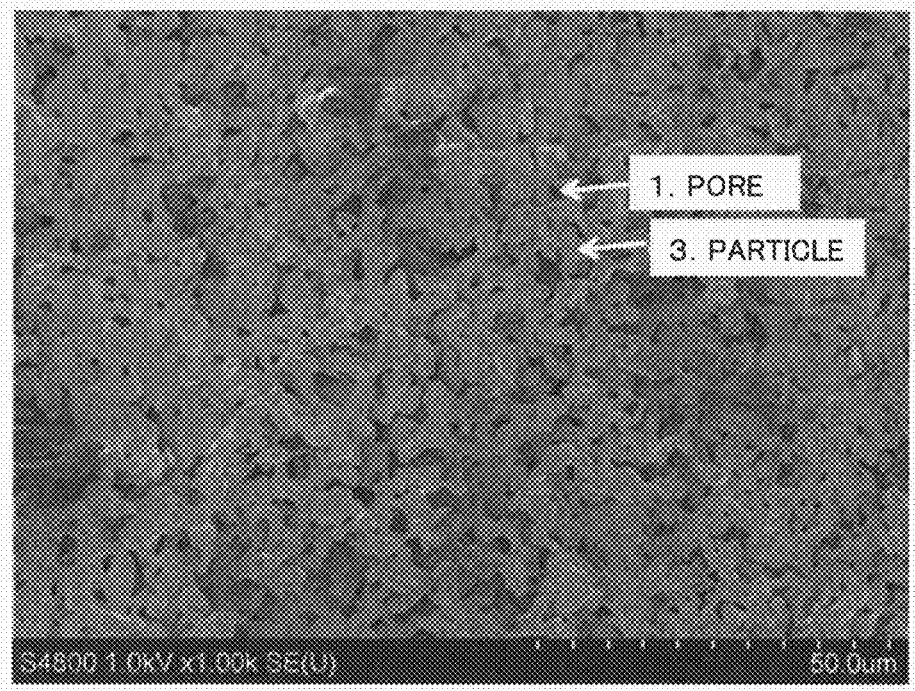
FIG. 4 is a SEM photograph of the fractured surface of the emitter of Example 1 of the present invention.
Figure 5:
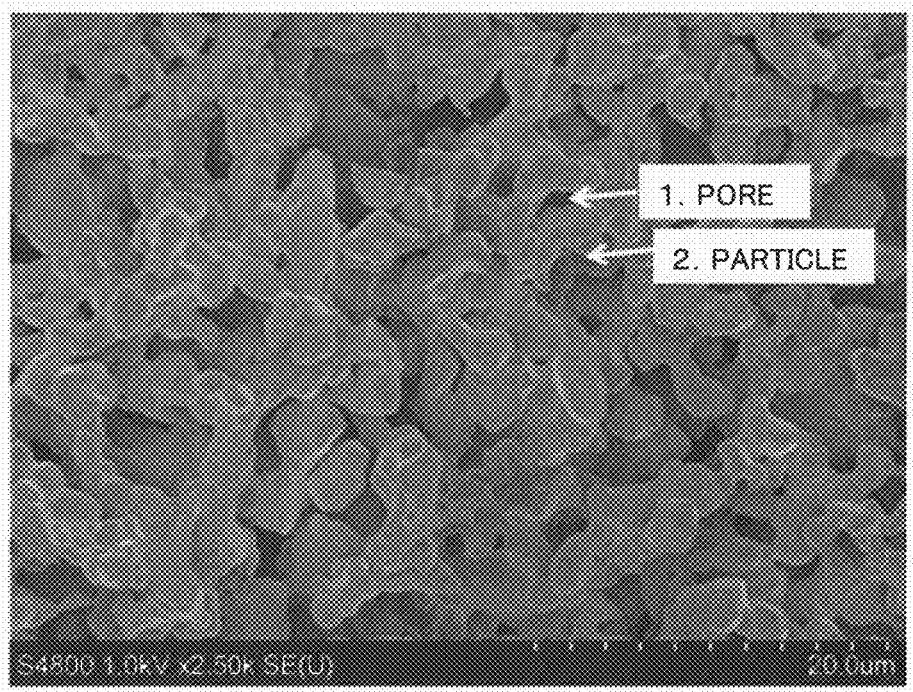
FIG. 5 is a SEM photograph of the fractured surface of the emitter of Example 1 of the present invention.

FIG. 2 illustrates a powder X-ray diffraction (XRD) pattern of the sintered body. From this pattern, the sintered body is confirmed as having a garnet structure of $Yb_3Al_5O_{12}$. FIG. 3 illustrates a scanning electron microscope photograph (SEM image) of the surface of this sintered body. It is observed that the sintered body has pores 1 on the surface thereof, and also that the sintered body is a polycrystal formed by $Yb_3Al_5O_{12}$ particles 3. Further, FIG. 4 illustrates an SEM image of a fractured surface of the sintered body. Many pores 1 can be confirmed, and also the pores 1 are found to be connected in a complicatedly intricate manner. FIG. 5 illustrates an enlarged SEM image of the fractured surface of the sintered body. It is confirmed that the section of the pore connected portion makes a hole of approximately 2 μm or less in diameter. Further, it is also confirmed that the particle 3 of the sintered body is 5 μm or less in diameter.

Figure 6:
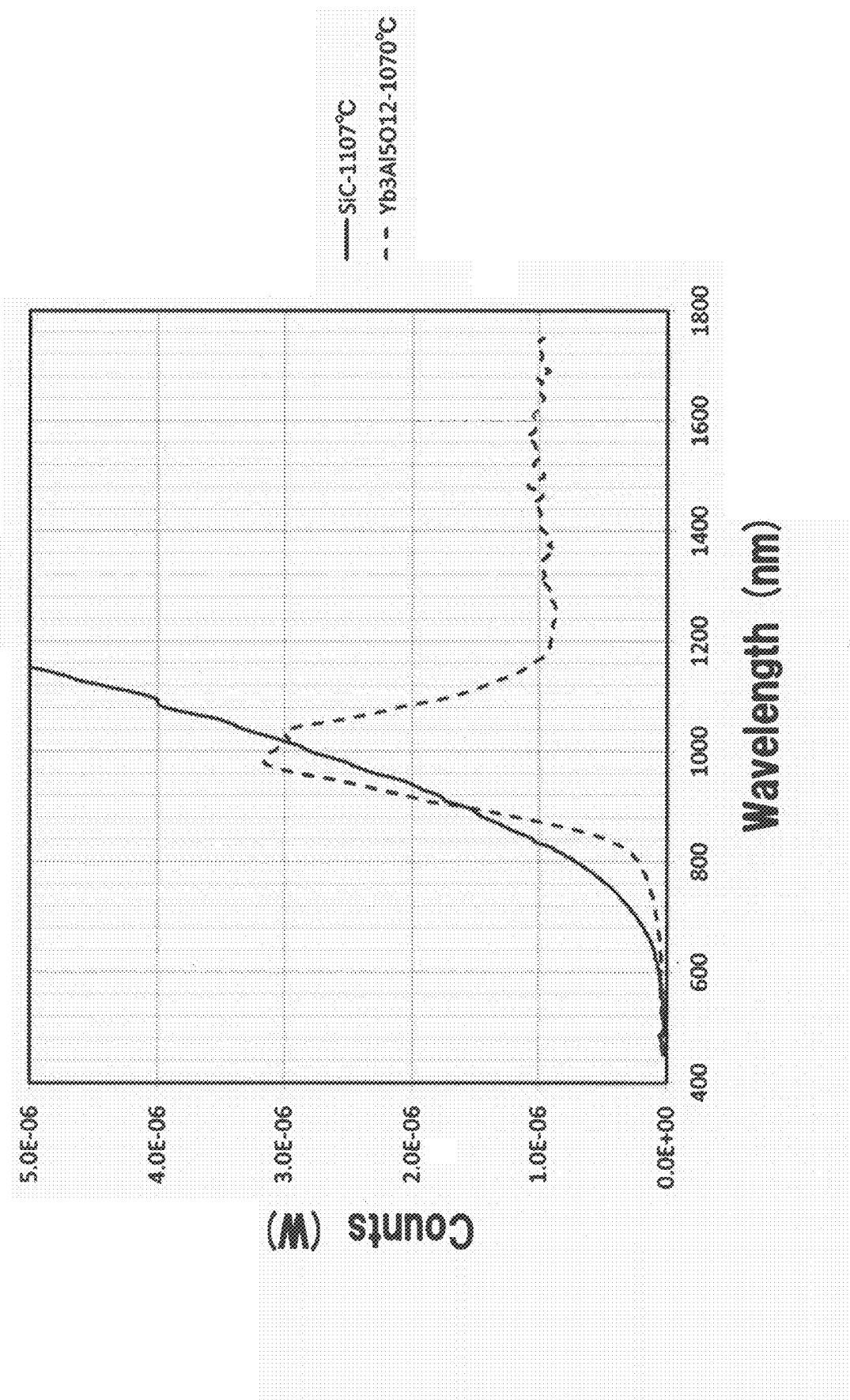
FIG. 6 is a thermal radiation spectrum of the emitter of Example 1 of the present invention.

The thermal radiation spectrum is measured by heating one surface of the obtained sintered body disc and inputting a portion of the radiation light from the other side of the disc to an optical spectrum analyzer through a fiber. Heating of the sintered body pellet is performed, in a state where the SiC ceramic plate is pressed against the pellet, by heating SiC with beam irradiation of a halogen lamp from the back side of the pellet-pressing surface of the SiC plate, and then conducting the heat to the sintered body. Further, the temperature measurement of the thermal radiation surface of the pellet is performed in a state where a type K thermocouple is pressed against the pellet while the pellet is fixed. FIG. 6 illustrates a measurement result of a thermal radiation spectrum of the ceramic emitter of Example 1 at 1070° C. The horizontal axis (wavelength) is a wavelength in nm units, while the vertical axis (counts) is a thermal radiation spectrum intensity in W units. For comparison, FIG. 6 also illustrates a thermal radiation spectrum of SiC ceramic at 1107° C. measured by the same optical system as above. It is confirmed that the spectrum of the $Yb_3Al_5O_{12}$ sintered body of Example 1 has selectivity with a peak at a wavelength of approximately 1000 nm. Accordingly, it is observed that the radiation of a wavelength of 1200 nm or more that corresponds to a band gap of the Si photovoltaic cell is suppressed. If the ratio of the emissivity at a peak wavelength to the emissivity at a wavelength of 1750 nm is calculated based on these radiation intensity measurements, the ratio becomes 13 or more. Thus, the selectivity that well exceeds the emissivity ratio of 2 or less indicated in the background art can be confirmed. Further, while SiC is known as having a grey body with emissivity of 0.9, it is confirmed that the radiation intensity of the $Yb_3Al_5O_{12}$ sintered body at a peak wavelength in Example 1 indicates radiation of higher intensity than SiC.

Example 2

As materials of a ceramic emitter, $Yb_2O_3$ and $Ga_2O_3$ powders are used and mixed in the same way as Example 1, calcined at 1600° C. for 2 hours in the atmosphere, pressed into a pellet, and then fired at 1500° C. for 2 hours to obtain a $Yb_3Ga_5O_{12}$ sintered body.

It is confirmed by powder X-ray diffraction that the sintered body obtained in the same way as Example 1 has a single phase garnet structure. Further, the size of the sintered body is 12.7 mm in diameter and 0.9 mm in thickness. The porosity is 32% by the density measurement.

Figure 7:
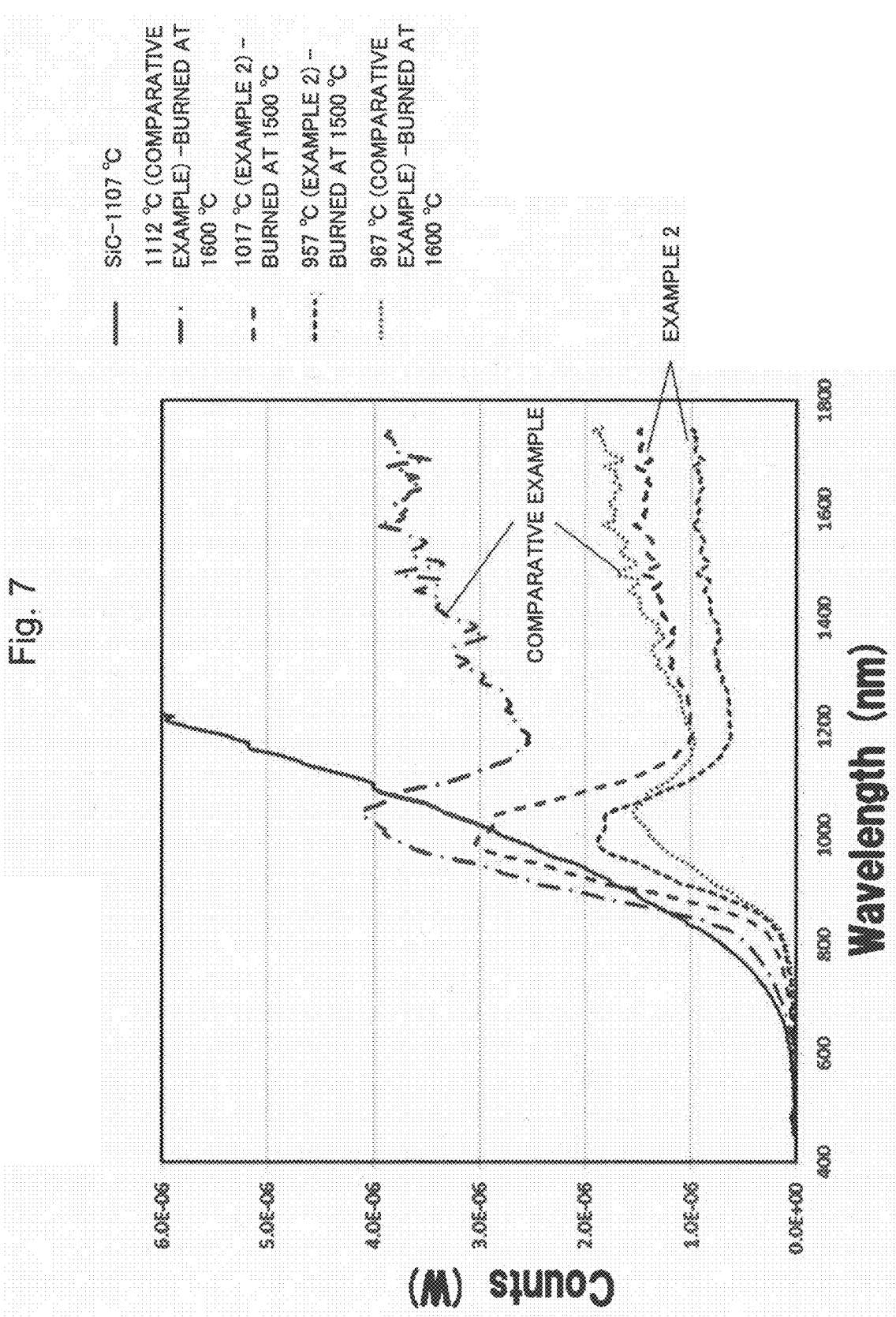
FIG. 7 is thermal radiation spectra of emitter of Example 2 and Comparative Example of the present invention.

The thermal radiation spectra of the sintered body are measured at 957° C. and 1017° C. in the same way as Example 1 and the results are illustrated in FIG. 7. In the same way as Example 1, selective radiation can be confirmed at a wavelength of approximately 1000 nm that matches with the sensitivity wavelength of the Si photovoltaic cell, while radiation of a wavelength of 1200 nm or more is suppressed. It is observed that the wavelength selectivity slightly improves when the radiation temperature is higher, while the wavelength selectivity is sufficiently high even at 957° C. When the ratio of the emissivity at a peak wavelength to the emissivity at a wavelength of 1750 nm in radiation at 1017° C. is calculated in the same way as Example 1, the value is 11 or more, which is a good value. Further, FIG. 7 illustrates a thermal radiation spectrum of SiC at 1107° C. It is observed that the $Yb_3Ga_5O_{12}$ sintered body of Example 2 can gain higher radiation intensity around a peak wavelength than SiC, even though the radiation spectrum of the sintered body was obtained at a lower temperature than that of SiC by 90° C.

Example 3

As materials of a ceramic emitter, $Er_2O_3$ and $Ga_2O_3$ powders are used and mixed in the same way as Example 1, calcined at 1600° C. for 2 hours in the atmosphere, pressed into a pellet, and fired at 1500° C. for 2 hours to obtain an $Er_3Ga_5O_{12}$ sintered body.

It is confirmed by powder X-ray diffraction that the sintered body obtained in the same way as Example 1 has a single phase garnet structure. Further, the size of the sintered body is 12.7 mm in diameter and 1.0 mm in thickness. The porosity is 25% by the density measurement.

Figure 8:
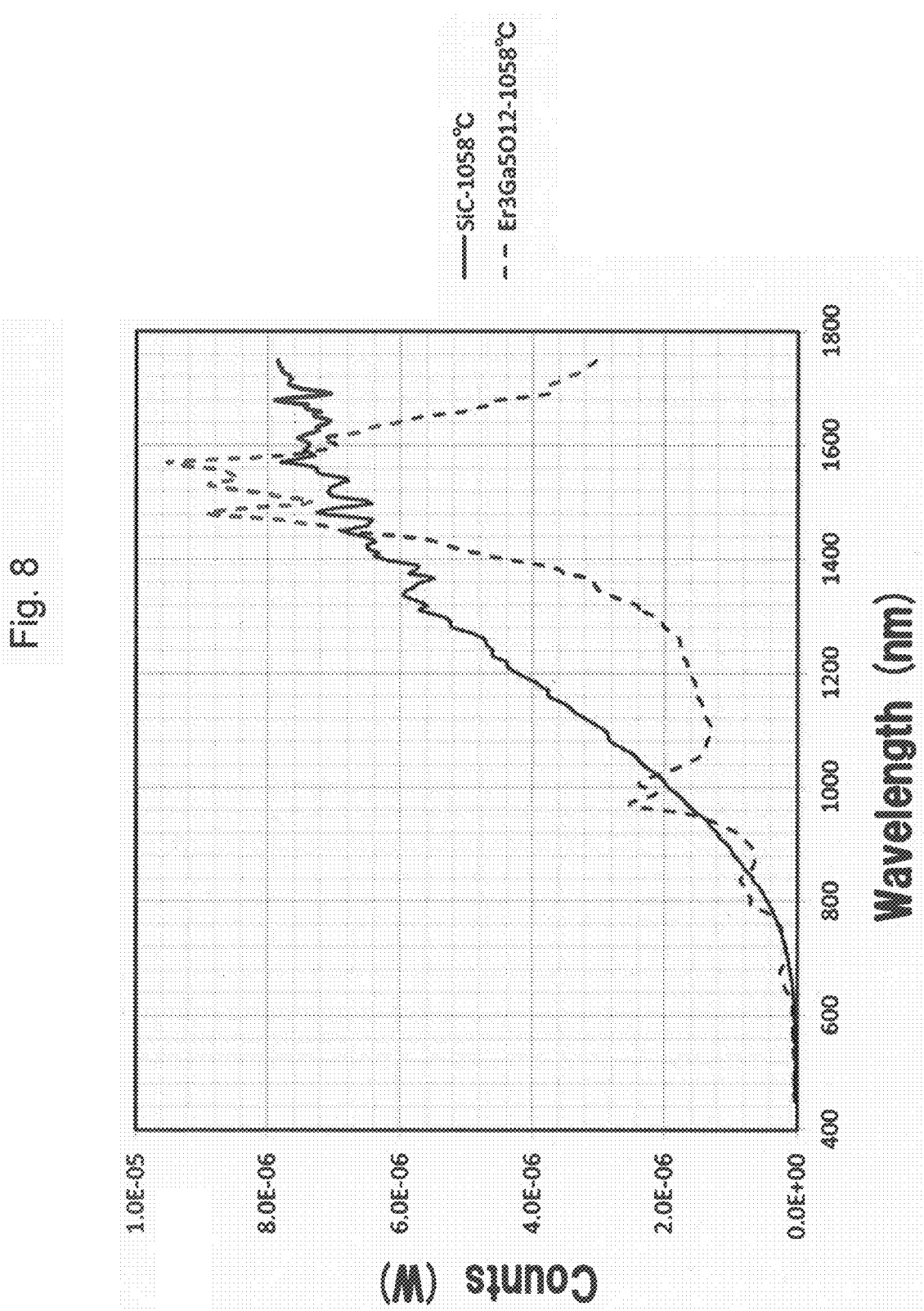
FIG. 8 is a thermal radiation spectrum of the emitter of Example 3 of the present invention.
Figure 9:
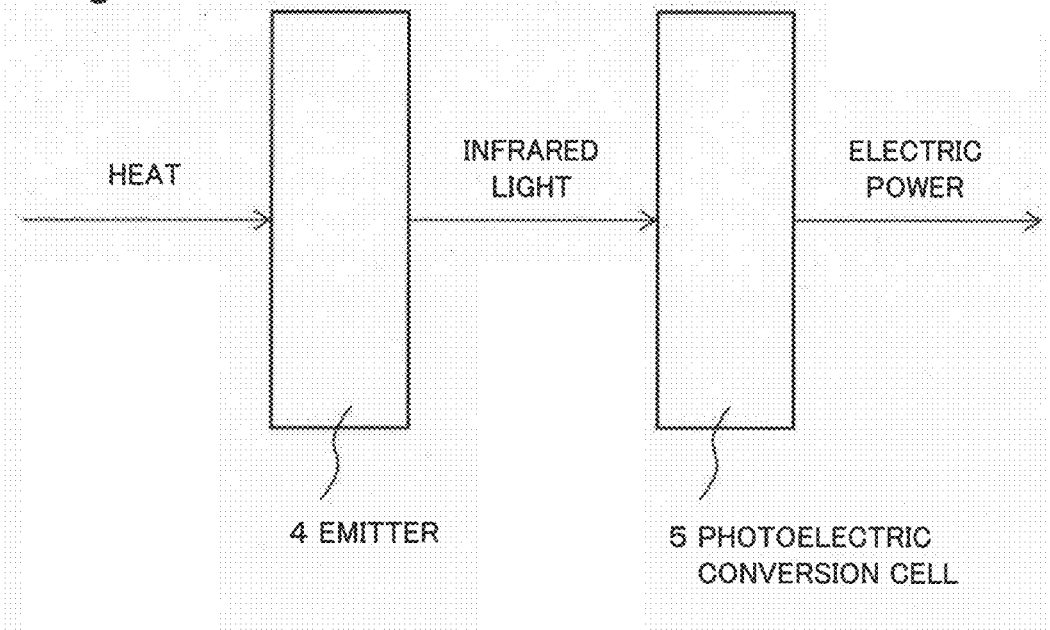
FIG. 9 is a configuration diagram illustrating a thermophotovoltaic power generation device pertaining to the present invention.
Figure 10:
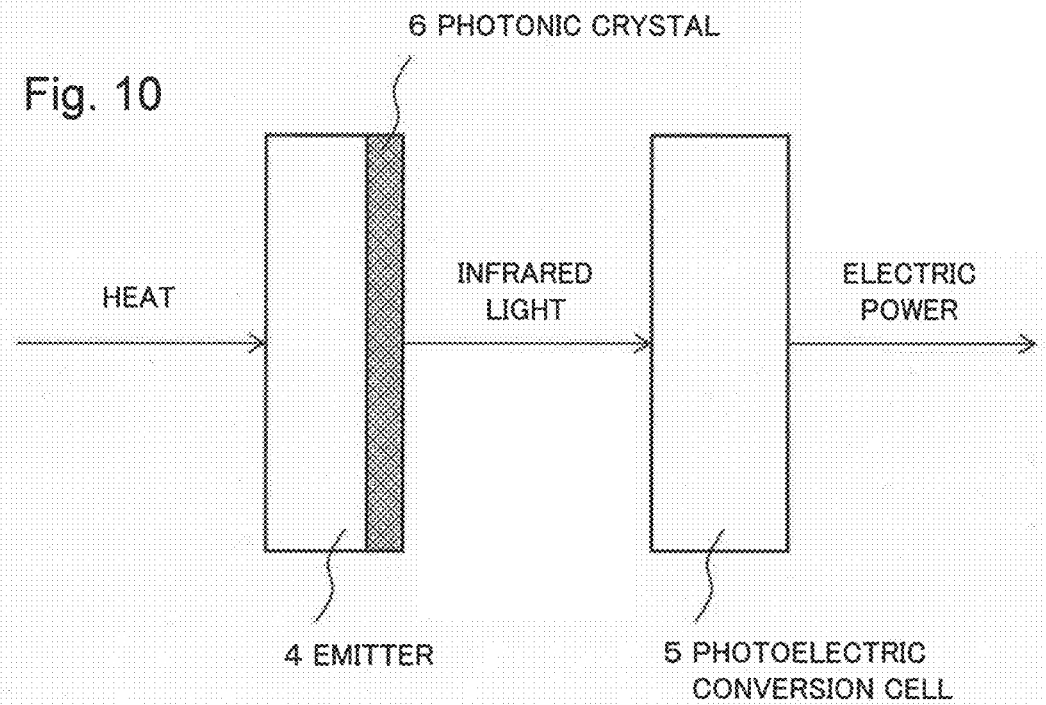
FIG. 10 is a configuration diagram illustrating a thermophotovoltaic power generation device pertaining to the present invention.
Figure 11:
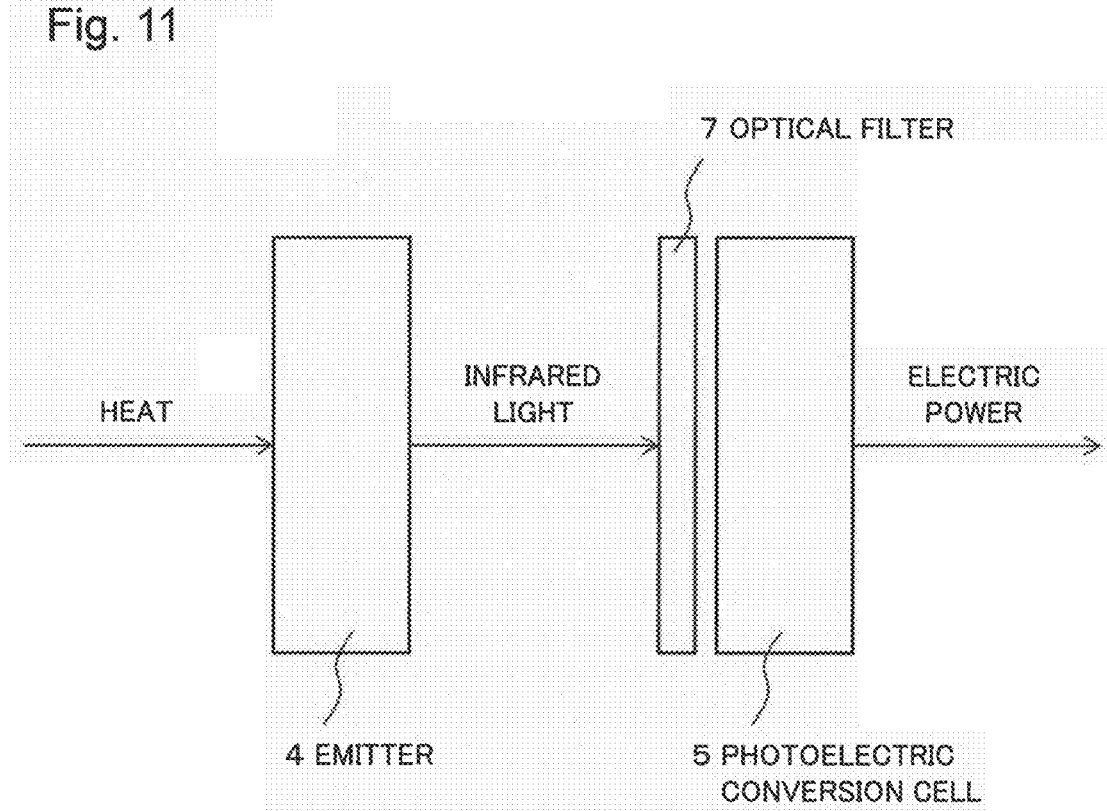
FIG. 11 is a configuration diagram illustrating a thermophotovoltaic power generation device pertaining to the present invention.
Figure 12:
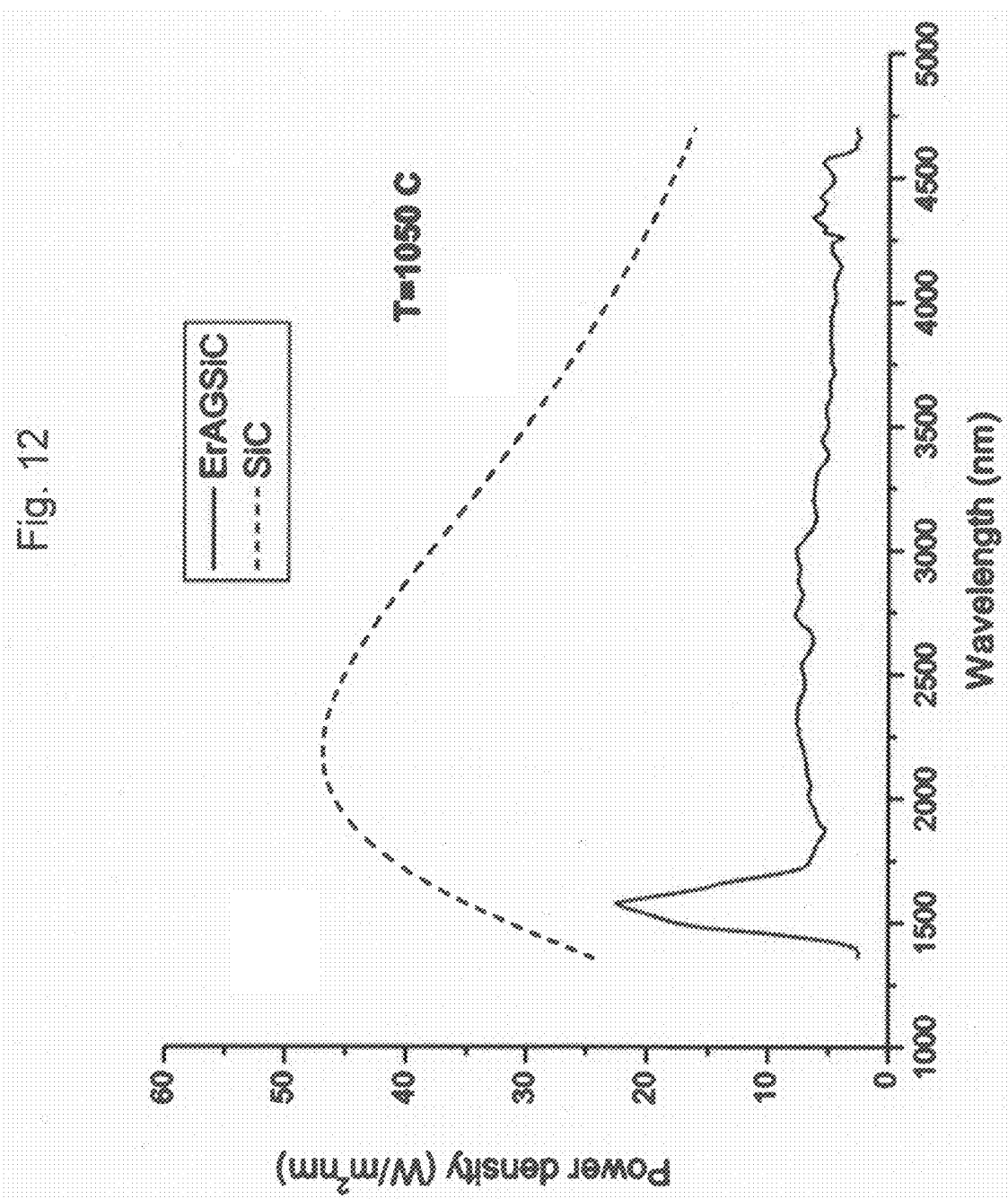
FIG. 12 is a thermal radiation spectrum of a ceramic emitter of NPL 1.

The result of measuring a thermal radiation spectrum of the sintered body at 1058° C. in the same way as Example 1 is illustrated in FIG. 8, together with the measurement result of SiC at the same temperature. Selective radiation can be confirmed at a wavelength of approximately 1500 nm that matches with the sensitivity wavelength of a GaSb photovoltaic cell, whose band gap corresponds to the wavelength of 1700 nm. The ratio of the emissivity at a peak wavelength to the emissivity at a wavelength of 1750 nm calculated from this radiation spectrum is 3 or more, which is double or more of the background art. It is also observed that higher radiation intensity than SiC can be obtained at around the peak wavelength.

It is noted that, while ceramic emitters using Yb and Er for rare-earth element R are described in the above-descried examples 1 to 3, other rare-earth element may be used instead.

Comparative Example 1

Similar to Example 2, $Yb_2O_3$ and $Ga_2O_3$ are mixed, calcined, pressed into a pellet, and fired at 1600° C. for 12 hours to obtain a $Yb_3Ga_5O_{12}$ sintered body. It is confirmed by powder X-ray diffraction that the sintered body obtained in the same way as Example 2 has a single phase garnet structure. Further, the size of the sintered body is 11.5 mm in diameter and 0.9 mm in thickness. The porosity is 19% by the density measurement. The thermal radiation spectra of the sintered body at 1112° C. and 967° C. are measured in the same way as Example 2 and the results are illustrated in FIG. 7, together with the results of Example 2. Although there is a difference in measurement temperatures, the wavelength selectivity of the spectra is obviously poorer compared with the spectrum of the sintered body of Example 2. In this Comparative Example with the radiation spectrum at 967° C., the radiation intensity is larger value than the spectrum at 1017° C. in Example 2 at a wavelength exceeding 1200 nm, which corresponds to the band gap of Si. In contrast, it is observed that the intensity at the peak wavelength is significantly smaller than Example 2. Further, in this Comparative Example with the spectrum at 1112° C., while the peak intensity is sufficiently large compared with Example 2, it is clear that the radiation suppression in a wavelength of 1200 nm and more is not sufficient. For the spectrum at 1112° C. in this Comparative Example, calculation of the ratio of the emissivity at a peak wavelength to the emissivity at a wavelength of 1750 nm produces less than 4. This is insufficient compared with the value in Example 2, which is 11 or more.

As above, the present invention has been described with the above-described example embodiment as a model example. However, the present invention is not limited to the above-described example embodiment. In other words, the present invention can be applied to a variety of modes that can be understood by those skilled in the art within the scope of the present invention.

This application claims priority based on Japanese Patent Application No. 2014-190274, filed on Sep. 18, 2014, disclosure of which is incorporated herein in its entirety.

REFERENCE SIGNS LIST

1 Pore
2 Dense polycrystalline part
3 Particle
4 Emitter
5 Photoelectric conversion cell
6 Photonic crystal
7 Optical filter

The invention claimed is:

1. A ceramic emitter for thermal radiation comprising a polycrystalline body having a garnet structure represented by a compositional formula $R_3Al_5O_{12}$ (R: rare-earth element) or $R_3Ga_5O_{12}$ (R: rare-earth element), the polycrystalline body having pores with a porosity of not less than 20% and not more than 40%, wherein the pores includes a portion where the pores are coupled to one another but not linearly continuous, inside the polycrystalline body, wherein R is Yb or Er in the compositional formulas $R_3Al_5O_{12}$ and the $R_3Ga_5O_{12}$.

2. The ceramic emitter for thermal radiation according to claim 1, wherein the polycrystalline body is a sintered polycrystalline body.

3. The ceramic emitter for thermal radiation according to claim 1, wherein a cross-section area of the pore of the polycrystalline body is 5 μm² or less.

4. The ceramic emitter for thermal radiation according to claim 1, wherein the polycrystalline body is formed by a particle with particle size of 5 μm or less.

5. The ceramic emitter for thermal radiation according to claim 1, wherein a thickness between a heat supply surface and a radiation surface is 0.8 mm or more.

6. The ceramic emitter for thermal radiation according to claim 1, wherein the ceramic emitter is for a thermophotovoltaic device.

* * * * *